(12) United States Patent
Wyatt

(10) Patent No.: US 7,587,187 B2
(45) Date of Patent: Sep. 8, 2009

(54) ULTRA WIDE BAND, DIFFERENTIAL INPUT/OUTPUT, HIGH FREQUENCY ACTIVE MIXER IN AN INTEGRATED CIRCUIT

(75) Inventor: Michael A. Wyatt, Clearwater, FL (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 470 days.

(21) Appl. No.: 11/504,426

(22) Filed: Aug. 15, 2006

(65) Prior Publication Data
US 2008/0003972 A1      Jan. 3, 2008

Related U.S. Application Data

(60) Provisional application No. 60/817,431, filed on Jun. 29, 2006.

(51) Int. Cl.
*H04B 1/06* (2006.01)
(52) U.S. Cl. .................. 455/232.1; 455/296; 455/313; 455/323; 455/333
(58) Field of Classification Search .............. 455/232.1, 455/296, 313, 323, 333
See application file for complete search history.

(56) References Cited

U.S. PATENT DOCUMENTS

| | | | |
|---|---|---|---|
| 5,455,543 A | 10/1995 | Kechkaylo | |
| 5,574,755 A | 11/1996 | Persico | |
| 6,114,921 A | 9/2000 | Aoki | |
| 7,403,758 B2* | 7/2008 | Rector | ...................... 455/232.1 |
| 2006/0166637 A1* | 7/2006 | Lore et al. | .................. 455/313 |

FOREIGN PATENT DOCUMENTS

EP           1 317 065 A1      6/2003

OTHER PUBLICATIONS

Tom K. Johansen et al., "Analysis and Design of Wide-Band SiGe HBT Active Mixers", IEEE, vol. 53, No. 7, Jul. 2005, pp. 2389-2397.

* cited by examiner

*Primary Examiner*—Sanh D Phu
(74) *Attorney, Agent, or Firm*—RatnerPrestia

(57) ABSTRACT

A wideband mixer includes a core mixer having input terminals and output terminals for, respectively, receiving differential input signals and providing amplified differential output signals. A steering module is coupled to the core mixer for receiving differential reference signals and providing bi-phase modulated amplified differential output signals. The core mixer is configured to provide a value of gain between the differential input signals and the differential output signals. A bandwidth peaking network is coupled to the core mixer and includes (a) a first coil and a first resistor connected in series and (b) a second coil and a second resistor connected in series. The first coil and resistor and the second coil and resistor, respectively, are coupled to the core mixer for receiving the amplified differential output signals. The bandwidth peaking network is configured to increase the frequency bandwidth of the core mixer.

19 Claims, 12 Drawing Sheets

80

| Q1  | Q2  |
|-----|-----|
| Q19 | Q76 |

| HALF R36A | HALF R36B |
|-----------|-----------|
| HALF R36B | HALF R36A |

FIG. 9

ULTRA WIDE BAND, DIFFERENTIAL INPUT/OUTPUT, HIGH FREQUENCY ACTIVE MIXER IN AN INTEGRATED CIRCUIT

CROSS REFERENCE TO RELATED APPLICATIONS

This application claims priority of U.S. Provisional Patent Application Ser. No. 60/817,431, filed Jun. 29, 2006.

FIELD OF THE INVENTION

The present invention relates, in general, to a high frequency mixer. More specifically, the present invention relates to an ultra wide band (from DC to greater than 20 GHz), active mixer that is fabricated as an integrated circuit, and has differential input/output signal capabilities.

BACKGROUND OF THE INVENTION

A mixer typically has insertion loss and multiplies an input signal with a reference signal to generate an output signal having a predetermined amount of gain. The frequency components of the output signal are determined by the frequency components of the input signal and the frequency components of the reference signal.

When mixing very low level signals, there is a need to amplify the mixed signals before further processing is performed. Hence, the need for an amplifier stage. In wide band applications, the mixer stage and the amplifier stage must be designed to respond to the entire frequency band of operation. These are difficult design requirements.

It is difficult to fabricate a wide band mixer on a die for use as an integrated circuit (IC). It is even more difficult to fabricate an ultra wide band active mixer on a die having gain across a frequency band that spans from direct current (DC) up to a frequency in excess of 20 GHz. The present invention addresses such a mixer.

SUMMARY OF THE INVENTION

To meet this and other needs, and in view of its purposes, the present invention provides a wide band active mixer including (1) a core mixer having input terminals and output terminals for, respectively, receiving differential input signals and providing differential output signals, and (2) a steering module, coupled to the core mixer, for receiving differential reference signals as a first reference signal and a second reference signal. The core mixer is configured to provide bi-phase modulated differential output signals in response to the input signals and reference signals. The core mixer is configured to provide a value of gain between the differential input signals and the differential output signals.

The mixer further may include a bandwidth peaking network having (a) a first coil and a first resistor connected in series, and (b) a second coil and a second resistor connected in series, and (3) the first coil and resistor and the second coil and resistor, respectively, are coupled to the core mixer for receiving the amplified differential output signals. The bandwidth peaking network is configured to increase the frequency bandwidth of the mixer.

The mixer further includes a common mode bias network coupled between the output terminals for providing a voltage bias control feedback signal across the input terminals. The voltage bias control feedback signal is derived from a virtual ground common mode potential across the output terminals and is stepped down and applied to the input terminals.

It is understood that the foregoing general description and the following detailed description are exemplary, but not restrictive, of the invention.

BRIEF DESCRIPTION OF THE DRAWING

The invention is best understood from the following detailed description when read in connection with the accompanying drawing. Included in the drawing are the following figures:

FIGS. 8 and 9 are layouts showing the partitioning of transistors and resistors, which are located in a common centroid arrangement on a die, in accordance with an embodiment of the present invention;

DETAILED DESCRIPTION OF THE INVENTION

As will be described, the present invention provides an ultra wide band active mixer, operating between direct current (DC) and frequencies greater than 20 GHz. The present invention includes a bandwidth peaking network that extends the frequency response of the mixer. In addition, the present invention receives a pair of differential input signals and a pair of differential clock signals, and transmits a pair of differential output signals. The present invention also has a controlled input impedance and a controlled output impedance. Moreover, the present invention operates with a low supply voltage and includes a common mode biasing method for alternating current (AC) applications, and an accurate fixed ratio bias tracking scheme. These features all contribute to advantageous improvements of an ultra wide band active mixer that is disposed on a die and fabricated for use in an integrated circuit (IC) or chip.

Figure 1:
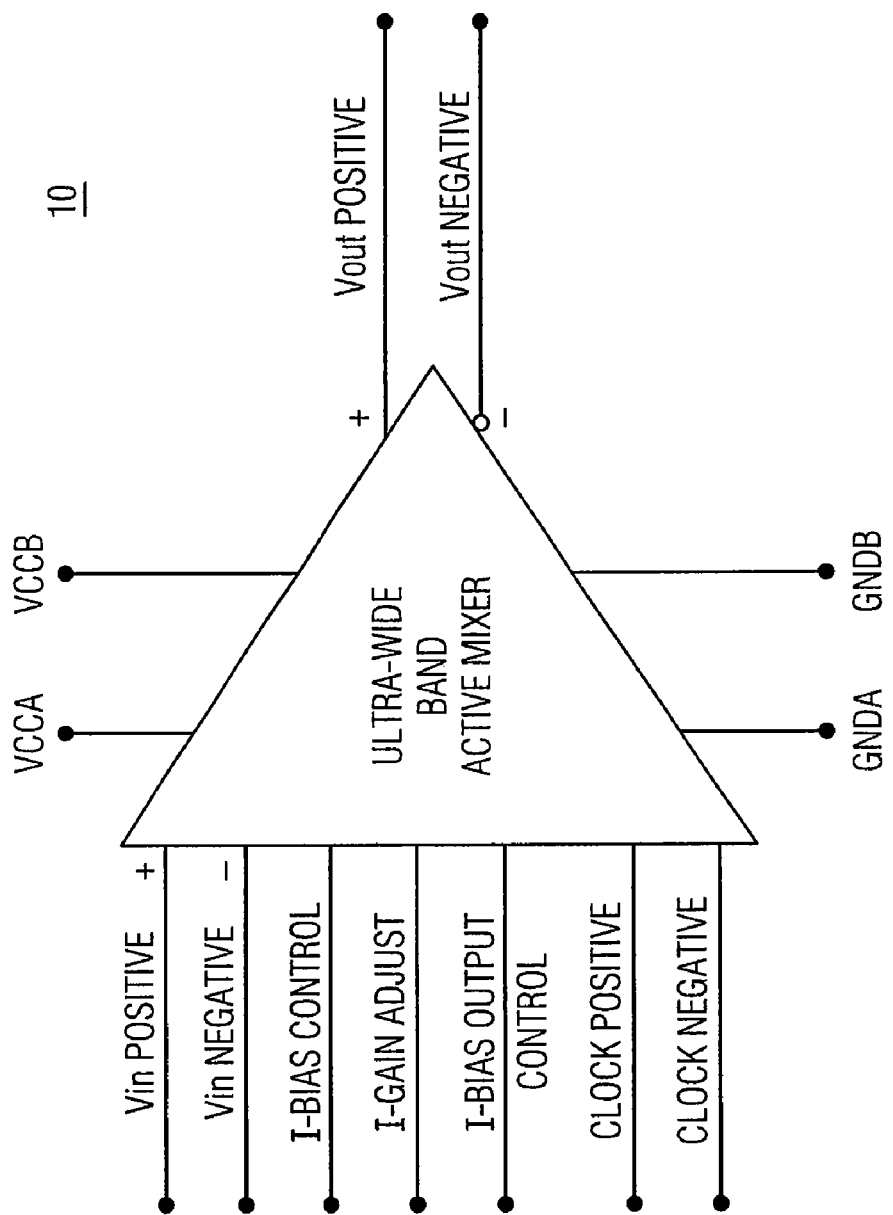
FIG. 1 is a functional diagram of the input and output signals of an ultra wide band active mixer, in accordance with an embodiment of the present invention.

Referring to FIG. 1, there is shown a functional input/output block diagram of an ultra wide band active mixer, generally designated as 10. In accordance with an embodiment of the present invention, ultra wide band active mixer 10 includes differential input signals, shown as Vin positive and Vin negative. The ultra wide band active mixer 10 also includes differential clock signals, shown as Clock positive and Clock negative. The ultra wide band active mixer 10 also includes differential output signals, shown as Vout positive and Vout negative. The ultra wide band active mixer 10 also includes biasing controls, shown as current (I)-bias output control, I-bias control, and I-gain adjust. These different biasing and gain adjust controls will be described later. Lastly, as shown in FIG. 1, ultra wide band active mixer 10 includes a VCCA and a VCCB primary power input of nominally 3.0 volts and a GNDA and a GNDB ground potential.

Figure 2:
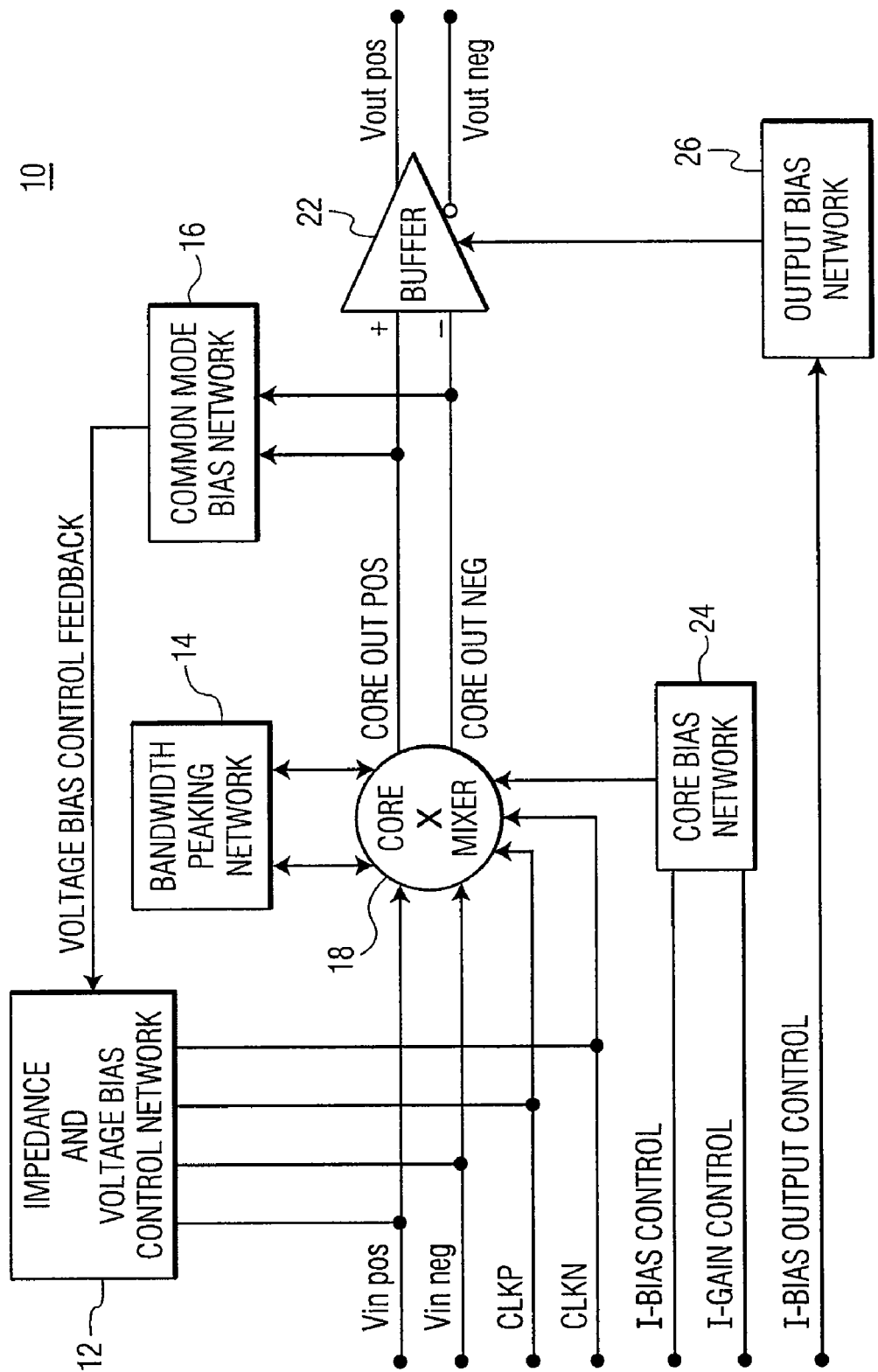
FIG. 2 is a functional block diagram of the ultra wide band active mixer shown in FIG. 1, in accordance with an embodiment of the present invention.

A functional block diagram of the ultra wide band active mixer is shown in FIG. 2. As shown, ultra wide band active mixer 10 includes core mixer 18, is which receives the positive input (Vin pos) and the negative input (Vin neg), being a pair of differential input signals. The core mixer 18 also receives the positive clock signal (CLK P) and the negative clock signal (CLK N), being a pair of differential input signals. The pair of differential output signals from core mixer 18, the core positive output signal (core out pos) and the core negative output signal (core out neg) are buffered by buffer 22 to provide the positive output signal (Vout pos) and negative output signal (Vout neg).

The biasing of the transistors of core mixer 18 (shown in FIG. 3) is provided by core bias network 24, which in turn is controlled by two input control signals of I-bias control and I-gain adjust. Biasing of the transistors of buffer 22 (shown in FIG. 4) is provided by output bias network 26, which in turn is controlled by an input signal of I-bias output control.

Core mixer 18 provides a gain adjusted amplification of 3 dBv across an ultra wide frequency band spanning from zero (DC) up to at least 20 GHz. The gain value of core mixer 18 may be maintained across the entire band of the mixer by use of bandwidth (BW) peaking network 14.

Ultra wide band active mixer 10 also includes tightly controlled input and output impedances. The input impedance is controlled by way of impedance and voltage bias control network 12, which in turn receives a voltage bias control feedback signal from common mode bias network 16. The common mode bias network 16 senses the voltage across the input terminals of buffer 22, as shown in FIG. 2. As will be described later, common mode bias network 16 includes a center tap node, which feeds back a common mode voltage to the impedance and voltage bias control network 12 at the input terminals of ultra wide band active mixer 10. Consequently, the same voltage bias value is supplied to the positive input terminal and the negative input terminal.

Figure 3:
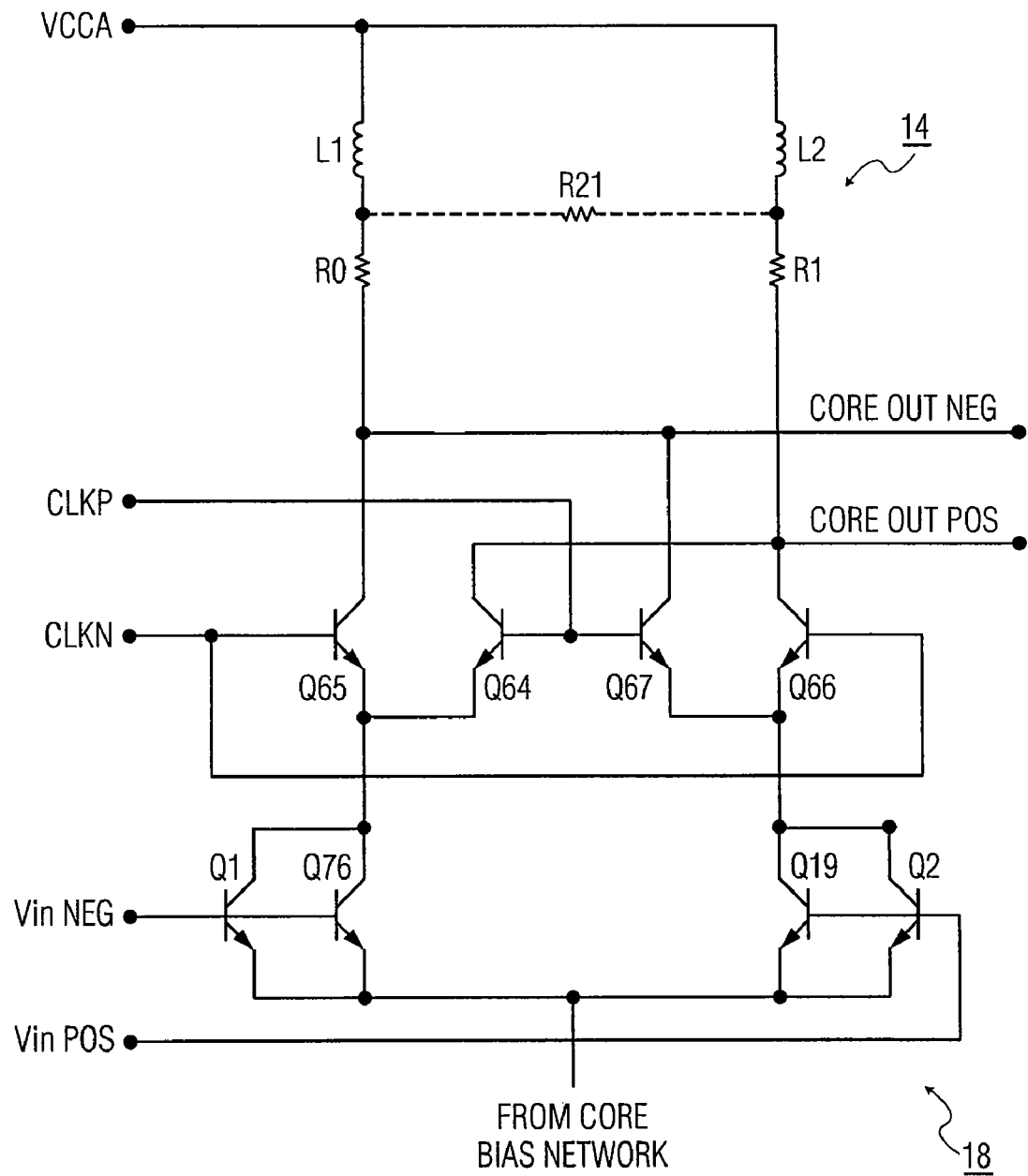
FIG. 3 is a schematic diagram of a bandwidth peaking network and a core mixer shown in FIG. 2, in accordance with an embodiment of the present invention.

Referring next to FIG. 3, there is shown greater detail of core mixer 18 and bandwidth peaking network 14. In the embodiment shown in FIG. 3, transistors Q1 and Q76 are physically two separate transistors on the die; it will be appreciated, however, that transistors Q1 and Q76 behave as one transistor (it is noted that the bases of the transistors are connected; the collectors of the transistors are connected; and the emitters of the transistors are connected). Similarly, transistors Q2 and Q19 behave as one transistor.

A negative input signal is provided into core mixer 18 by way of the bases of transistors Q1 and Q76; and a positive input signal is provided into core mixer 18 by way of the bases of transistors Q2 and Q19. A negative clock input signal is provided into core mixer 18 by way of the bases of transistors Q65 and Q66; and a positive clock input signal is provided into core mixer 18 by way of the bases of transistors Q64 and Q67. The output signals, namely the core out negative signal and the core out positive signal are provided as output differential signals by way of, respectively, the collectors of transistors Q65 and Q67, and the collectors of transistors Q64 and Q66. In this manner, core mixer 18 effectively provides a pair of differential output signals.

The biasing of the transistors of core mixer 18 is provided by way of core bias network 24 (FIG. 2). As shown in FIG. 3, the emitter of each transistor Q1, Q76, Q19 and Q2 is connected to core bias network 24. Each of these four emitters is biased by the same bias current (I). The emitters of transistors Q65 and Q64 are connected to the collectors of transistors Q1 and Q76. Similarly, the emitters of transistors Q67 and Q66 are connected to the collectors of transistors Q19 and Q2. As described in greater detail later, the emitters of transistors Q65 and Q64 are biased by transistor Q68, by the bias of the emitter of transistors Q1 and Q76. Similarly, the emitters of transistors Q67 and Q66 are biased by transistor Q68, by the bias of the emitter of transistors Q19 and Q2.

The wide band mixer has a steering module which includes transistors Q65, Q64, Q67 and Q66 (FIG. 3). In operation, transistors Q65, Q64, Q67 and Q66 steer current between the input and output as a function of the clock signals (reference signals). The clock signals are, for example, digital square waves of opposite polarity with a nominal common mode center voltage of 2.4 volts and a nominal differential voltage of plus or minus 0.1 volts. These voltages have been found to be optimal for operation with a 3.0 volt VCCA supply. When CLKP is more positive than CLKN, CLKP drives the bases of transistors Q64 and Q67. Transistor Q64 conducts the current from transistors Q1 and Q76 (driven by the Vin negative input) to the Core Out Positive signal. Similarly, transistor Q67 conducts the current from transistors Q19 and Q2 (driven by the Vin positive input) to the Core Out Negative signal. Transistors Q65 and Q66 do not conduct.

When CLKN is more positive than CLKP, CLKN drives the bases of transistors Q65 and Q66. Transistor Q66 conducts current from transistors Q19 and Q2 (driven by the Vin positive input) to the Core Out Positive signal. Similarly, transistor Q65 conducts the current from transistors Q1 and Q76 (driven by the Vin negative input) to the Core Out Negative signal. Transistors Q64 and Q67 do not conduct. Therefore, the output polarity is controlled by the state of the clock. This is known as bi-phase modulation because the phase of the output signals change 180 degrees depending on the state of the clock signals. An example of the relationships among the input signals, the clock signals (reference signals) and the output signals is shown in FIGS. 13A-13F.

Figures 13A, 13B, 13C, 13D, 13E, 13F:
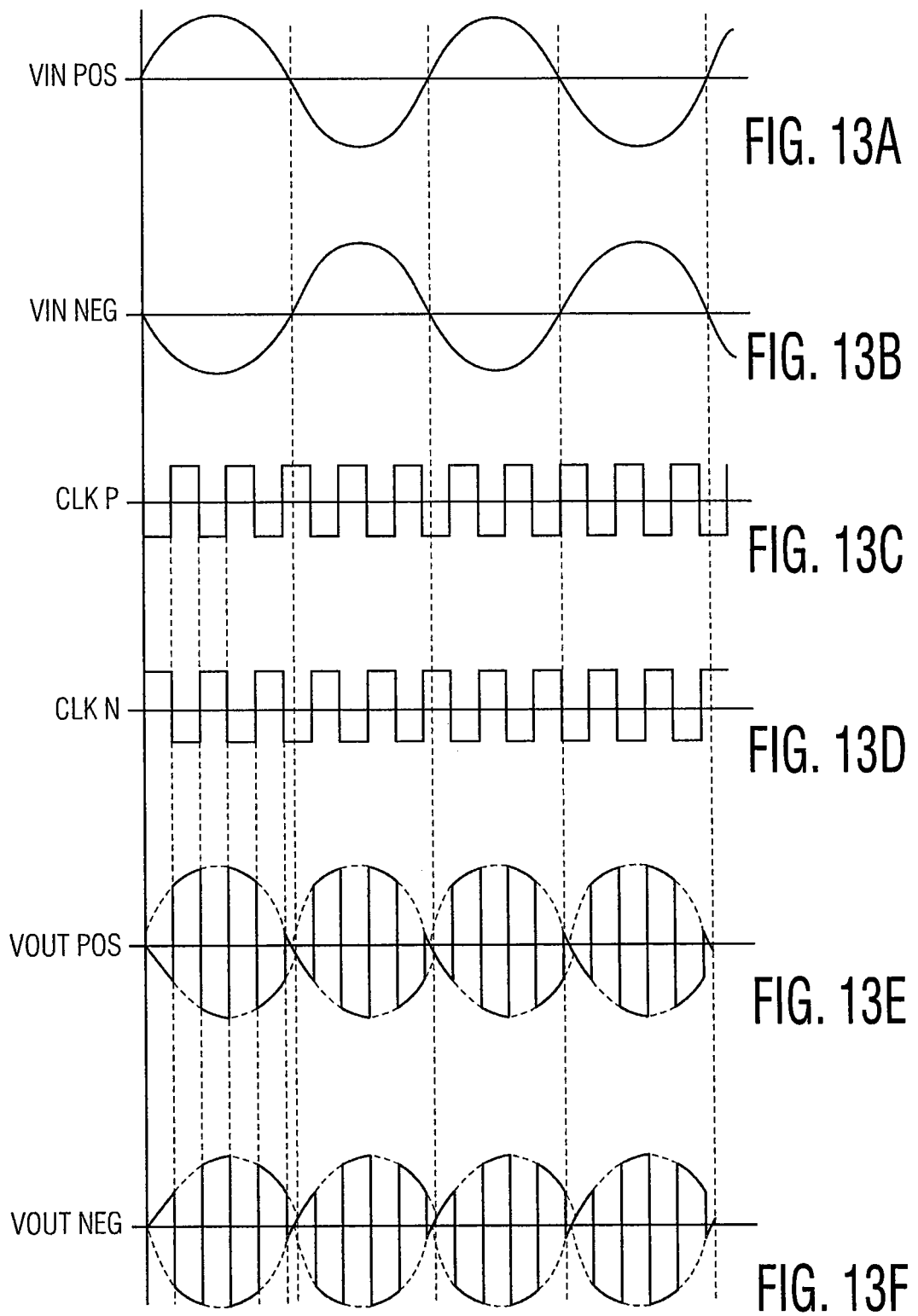

FIGS. 13A and 13B show a pair of differential input signals to ultra wide band active mixer 10, in arbitrary units. FIGS. 13C and 13D show a pair of differential clock signals (reference signals) that are provided to ultra wide band active mixer 10, in arbitrary units. FIGS. 13E and 13F show a pair of bi-phase modulated differential output signals from ultra wide band active mixer 10, which are provided in response to the input signals and the clock signals.

It will be appreciated that when the clock signals are not toggling and are held at a constant DC level, that the core mixer 18 functions as a wide band amplifier.

The current flowing from the collectors of transistors Q65 and Q67 is provided to a first set of resistor and inductor combination, namely R0 and L1 of the bandwidth peaking network 14. Similarly, the collector current provided by the combination of transistors Q64 and Q66 flows through a second set of resistor and inductor combination, namely R1 and L2 of bandwidth peaking network 14. Another resistor, designated as R21, optionally disposed between a node of R0 and L1 and another node of R1 and L2, is also configured to receive current from transistors Q64, Q65, Q66 and Q67.

It will be appreciated that the current flowing in the collectors of Q65 and Q67, and the current flowing in the collectors of Q64 and Q66, would start rolling-off at a first predetermined frequency. On the other hand, with bandwidth peaking network 14 included in the present invention, as shown in FIG. 3, the impedance seen at the collectors of Q64, Q65, Q66 and Q67 increases with frequency, thereby compensating for the collector current roll-off.

Figure 11A:
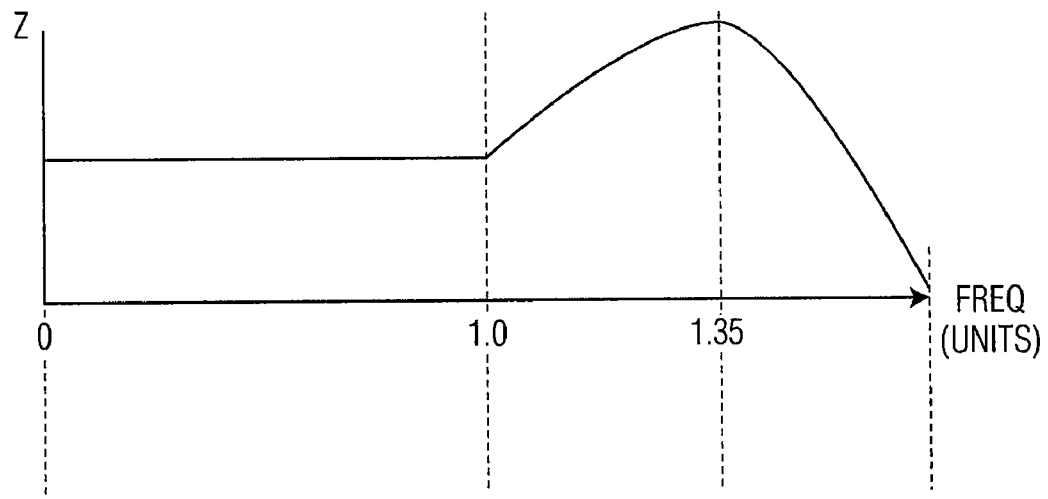
FIG. 11A is a plot of impedance level (Z) versus frequency (in arbitrary units)

The inventor has discovered that, preferably by experimentation, the gain provided by core mixer 18 may be adjusted to have a positive gain level from its lowest frequency response up to its maximum frequency response. Without resistor R21 inserted into bandwidth peaking network 14, the gain of core mixer 18 extends across a wide frequency band in a non-constant manner. In order to obtain a constant gain level over the entire frequency band, optional resistor R21 is included in the peaking network. This phenomenon is best shown by referring to FIGS. 11A and 11B. FIG. 11A provides a plot of impedance (Z) seen by Q64, Q65, Q66 and Q67, respectively, versus frequency in arbitrary units. The inventor has shown that bandwidth peaking network 14 increases the frequency response of ultra wide band active mixer 10 by as much as 35 percent. For example, if one unit is defined as 11 GHz, then 1.35 units is at 15 GHz and, correspondingly, the upper frequency response of ultra wide band active mixer 10 is also at 15 GHz. As another example, if one unit is defined as 16 GHz, then 1.35 units is at 21.5 GHz and, correspondingly, the upper frequency response of ultra wide band active mixer 10 is also at 21.5 GHz.

Figure 11B:
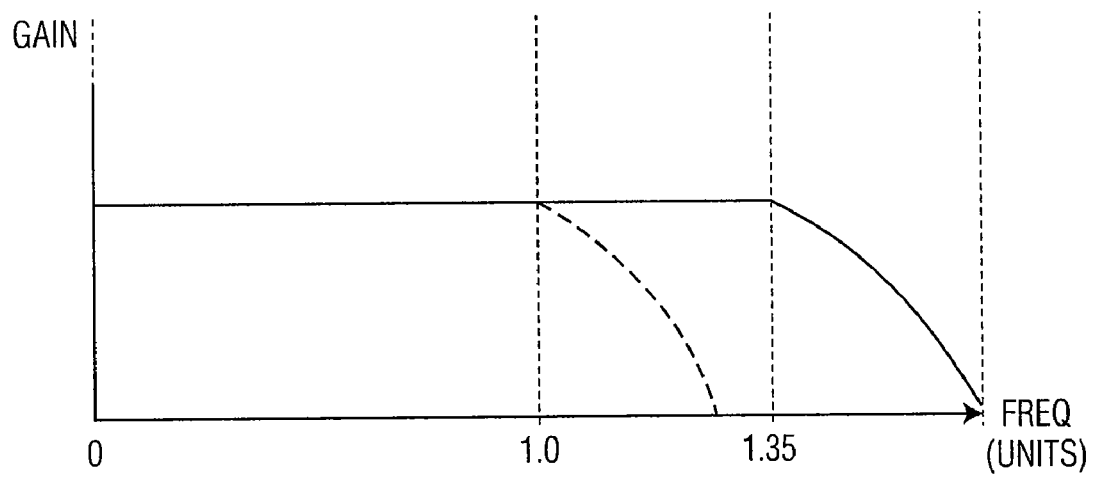
FIG. 11B is a plot of gain (dBv) versus frequency (in arbitrary units)

In operation, bandwidth peaking network 14 provides a substantially constant impedance level of Z up to 1.0 frequency units. From 1.0 frequency units up to 1.35 frequency units, the impedance level of Z increases, as shown in FIG. 11A. As a result, the gain of core mixer 18, resulting from the combination of transistors Q64, Q65, Q66 and Q67 extends at a substantially constant value until reaching the frequency of 1.35 units, as shown in FIG. 11B.

The inventor has found that preferably R0 has a value and physical construction that is similar to the value and physical construction of R1. Furthermore, optional resistor R21 has a value and physical construction that is similar to the value and physical construction of R0 and R1. Additionally, transistors Q64, Q65, Q66 and Q67 are preferably silicon germanium (SiGe) transistors which have a maximum transition frequency of 120 GHz. It will be appreciated that at the lower frequencies, bandwidth peaking network 14 presents an impedance that is substantially resistive in value. This is due to L1 and L2 having an inductive low impedance at the lower frequencies. Consequently, R0 and R1 are effectively directly connected to VCCA. If R21 is included in the peaking network, R0 and R1 being effectively connected directly to VCCA results in R21 being free-of any current flow.

It will be understood that the number and values of the components of bandwidth peaking network 14 on the die of the integrated circuit are complex. This is because there are many parasitic capacitances that exist between points across each physical resistor and points on the substrate of the die. Similarly, there are many parasitic capacitances that exist between points of each coil and points on the substrate. The impedance level Z varies as a function of frequency and is very complicated to calculate. As a result, the inventor prefers to find the resistive values of R0, R1 and R21 (when included) and the inductive values of L1 and L2 (which are equal to each other by symmetry) by experimentation. By experimentally adjusting the output gain response of core mixer 18 to be at a constant gain of 3 dBv, across the entire frequency bandwidth the values of R0, R1, R21, L1 and L2 may be determined.

The manner in which the gain of core mixer 18 is maintained at a constant value may be seen from the following simplified equations:

$$Vout = I(\omega) \cdot Z(\omega)$$

$$I(\omega) = Vin \cdot gm(\omega)$$

$$Vout = Vin \cdot gm(\omega) \cdot Z(\omega)$$

$$Vout/Vin = gm(\omega) \cdot Z(\omega)$$

where:
$gm(\omega)$ is the transconductance of the transistor as a function of frequency ($\omega$),
$Z(\omega)$ is the impedance presented to the transistor, and
Vout/Vin is the gain of the mixer.

The values of $Z(\omega)$ presented to core mixer 18 by the bandwidth peaking network 14 (which includes resistances, inductances, and parasitic capacitances) are adjusted so that the gain of the ultra wide band active mixer 10 is maintained at a constant value over the desired frequency range.

The positive mixer output and the negative mixer output differential signals are buffered by buffer 22 (FIG. 2), before the positive voltage output and negative voltage output differential signals are transmitted from ultra wide band active mixer 10. Buffer 22 is shown in more detail in FIG. 4. As shown, buffer 22 includes two transistors, designated as Q83 and Q85. The collector of each of these transistors is connected to VCCB (nominally 3.0 volts), the base of each transistor receives one of the differential output signals from core mixer 18, and the emitter of each transistor is biased by output bias network 26 (FIG. 2). The final differential output signals, namely Vout positive and Vout negative are provided by the emitters of Q83 and Q85, respectively. Thus, Q83 and Q85 behave as emitter followers and provide a gain value of less than one to the differential output signals of core mixer 18.

Figure 4:
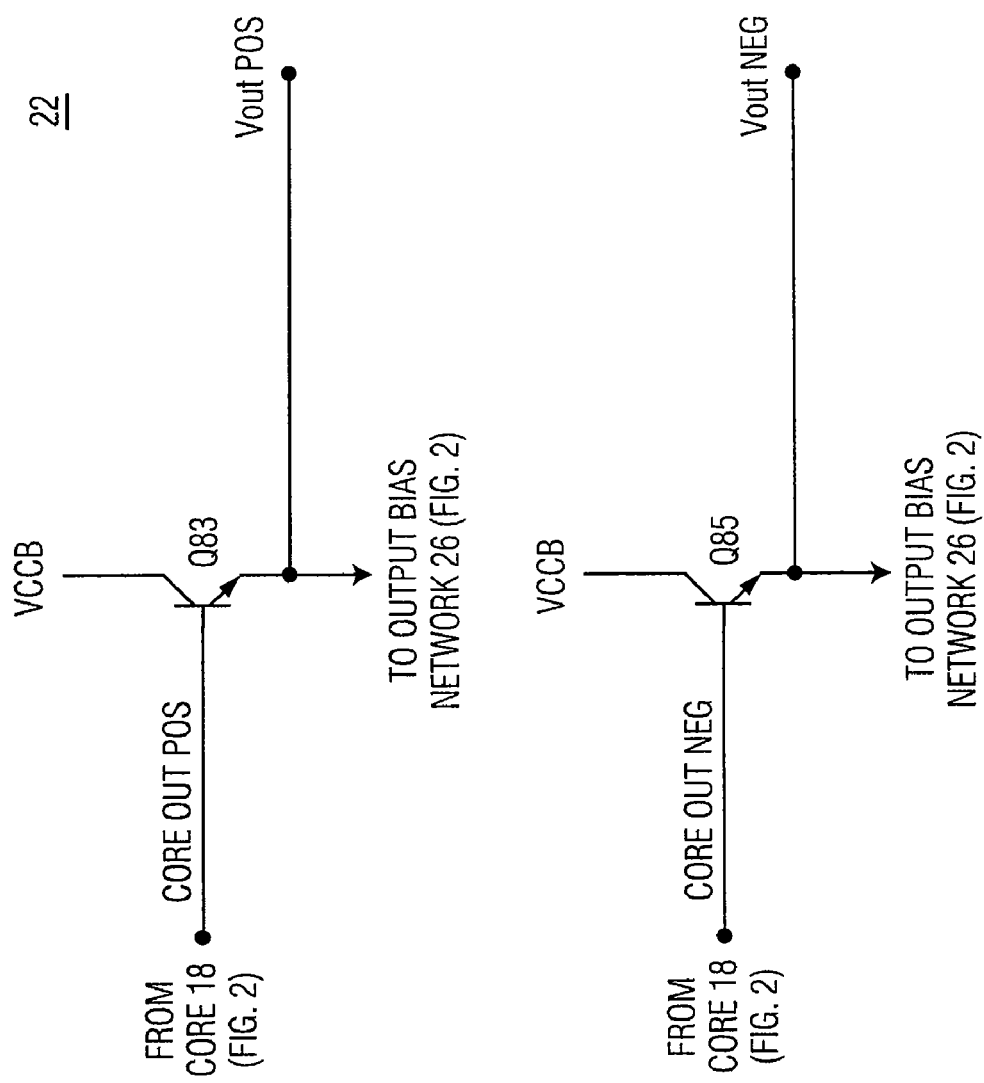
FIG. 4 is a schematic diagram of a buffer shown in FIG. 2, in accordance with an embodiment of the present invention.
Figure 5:
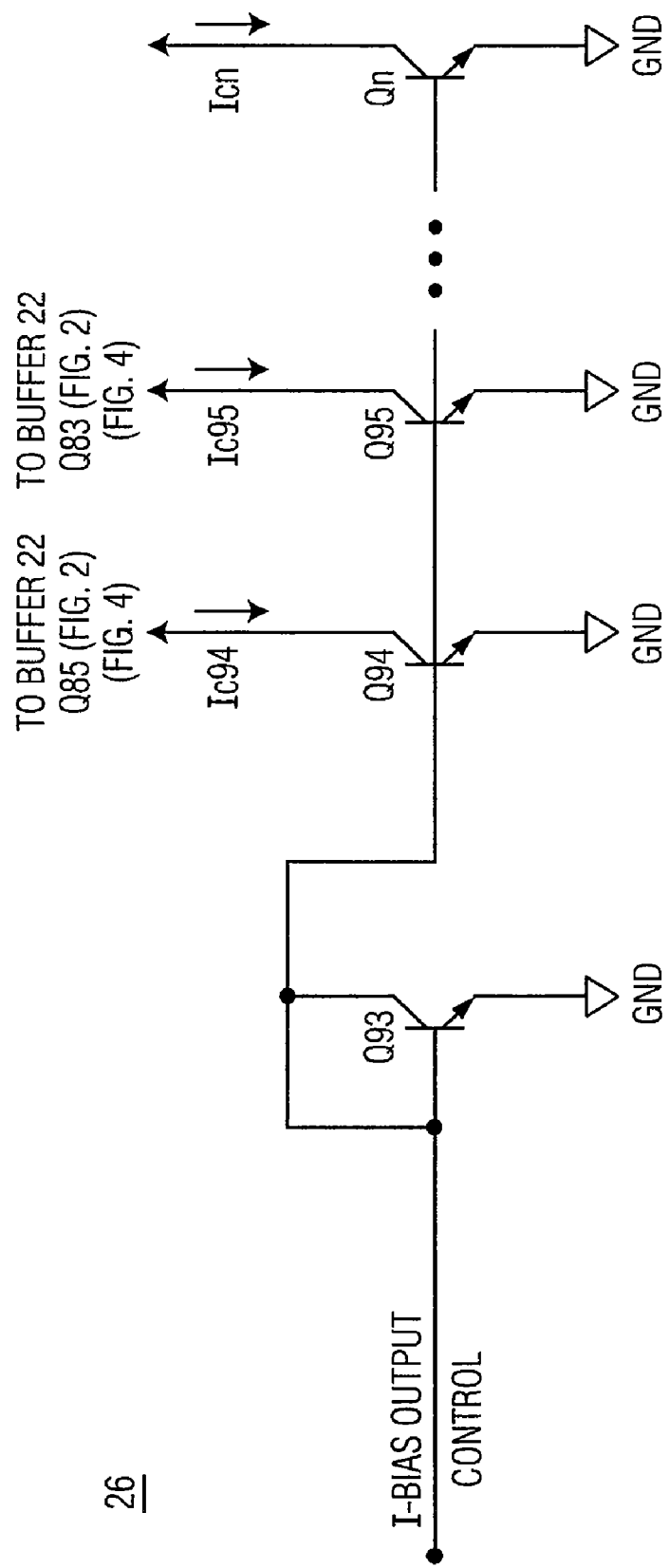
FIG. 5 is a schematic diagram of an output bias network shown in FIG. 2, in accordance with an embodiment of the present invention.

The biasing of the emitters of transistors Q83 and Q85 is shown in greater detail in FIG. 5. As shown, output bias network 26 provides a current bias to Q85 of buffer 22 (FIGS. 2 and 4). A collector current flowing in transistor Q95 is shown designated as Ic95 and biases the emitter of transistor Q83 of buffer 22 (FIGS. 2 and 4). Similarly, a collector current flowing in transistor Q94 is shown designated as Ic94 and biases the emitter of transistor Q85 of buffer 22 (FIGS. 2 and 4). It will be appreciated that the bases of transistors Q94 and Q95 are connected to each other and similarly controlled by the input signal of I-bias output control provided to transistor Q93. As shown, transistor Q93 has its collector and base connected together and coupled into output biasing transistors Q94 and Q95. Accordingly, the collector current of each of transistors Q94 and Q95 is substantially the same and the biases seen by the transistors of buffer 22 are substantially equal to each other.

More generally, output bias network 26 may include N biasing transistors in a chain, as shown. Each of the N biasing transistors have their bases connected together and coupled to input transistor Q93. The input signal of I-bias output control, which controls each transistor in the chain, may be used to set equal bias values to other transistors (not shown) in an output buffer stage (for example, buffer 22).

Figure 6:
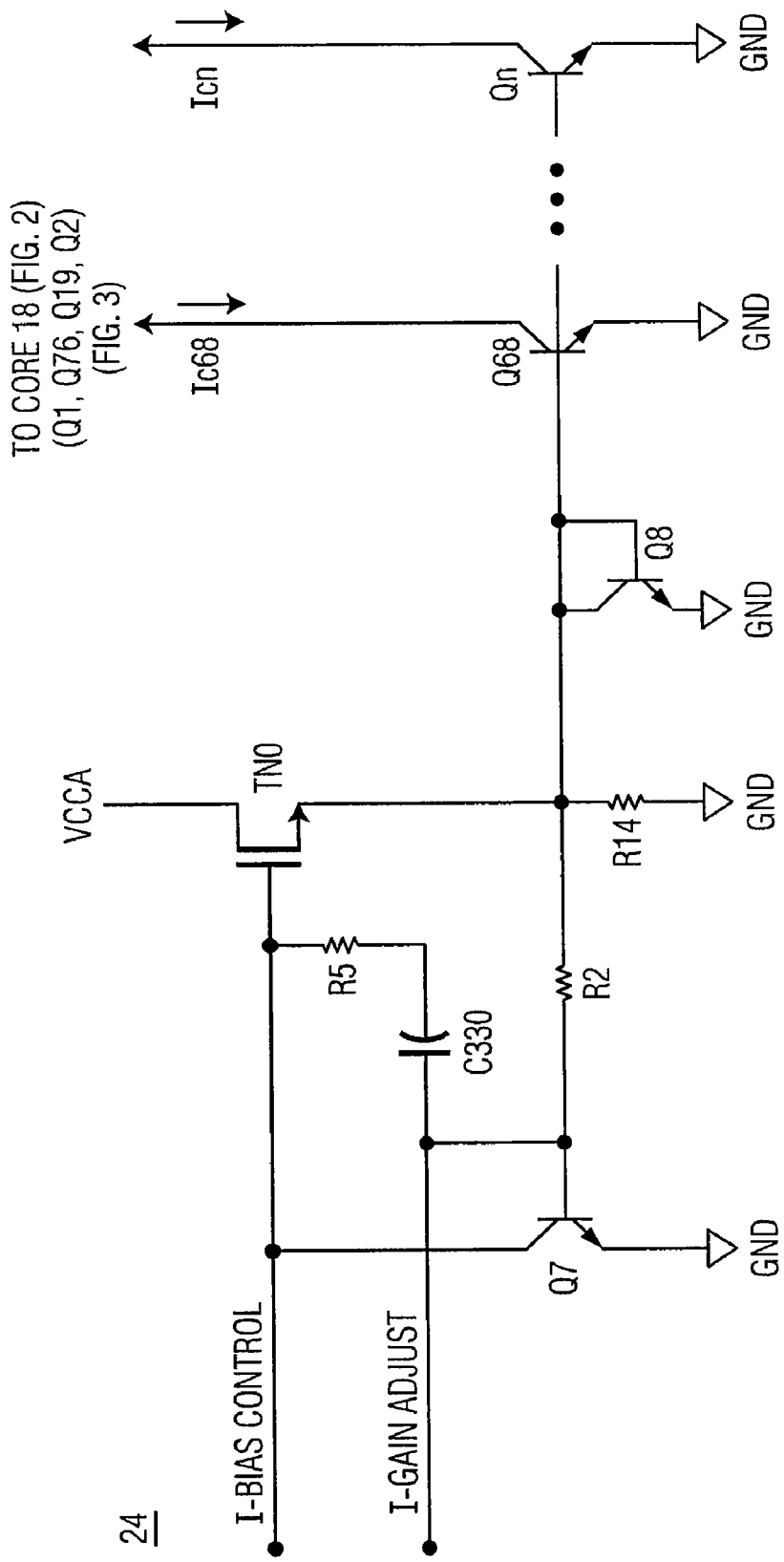
FIG. 6 is a schematic diagram of a core bias network shown in FIG. 2, in accordance with an embodiment of the present invention.

Having described output bias network 26, core bias network 24 will now be described. Referring to FIG. 6, there is shown core bias network 24. As shown, the core bias network is controlled by two input signals. The first input signal is I-bias control, which, for example, may have a nominal value of 500 μA in this embodiment. The second input signal is I-gain adjust, which, for example, may have a value of 33 μA per dB of gain reduction with a nominal range of 0 to 100 μA for a mixer gain of 3 dBv. The I-bias control signal is provided to the gate of field effect transistor (FET) TN0 by way of a compensation network, shown as R5 and C330, which prevent oscillation of TN0. Transistor Q8 and resistor R14 are bleeding elements and prevent gain slope reversal that may happen for large values of I-gain adjust.

The base of transistor Q68 is connected to the junction of R2 and R14. As shown, biasing transistor Q68 provides biasing current Ic68 to transistors Q1, Q76, Q19 and Q2 of core mixer 18. Q68 provides bias current related to its physical size relationship with respect to reference transistor Q7. In general, there may be additional core biasing transistors placed in a chain, which may be used to bias additional transistors (for example transistor Qn providing a biasing current of Icn) of another exemplary core amplifying mixer.

In operation, an increase in I-bias control provides additional current is flowing through the collector of the biasing transistor Q68, which, in turn provides an increase in collector current flowing into core mixer 18. In this manner, an increase in I-bias control results in an increase in gain of core mixer 18.

Working in an opposite manner, an increase in I-gain adjust results in an increased IR voltage drop across resistor R2 and a decreased IR drop across resistor R14. Consequently, as I-gain adjust increases, the current flowing into Q68 decreases in value. This, in turn, causes a decrease in the collector current of biasing transistor Q68. A decrease in the collector currents of this biasing transistor reduces the gain of core mixer 18.

Core biasing network 24 may include biasing transistors (for example Qn) that provide corresponding collector currents (for example Icn) that are different from each other. As an example, transistor Q68 may be required to provide a collector current of Ic68 at a value of 2 mA, whereas transistor Qn may be required to provide a collector current of Icn at a value of 1 mA. Such biasing ratio of 2 mA/1 mA may be achieved by implementing transistor Q68 physically twice as large as transistor Qn. As another example, transistor Q68 may be required to provide a collector current Ic68 at a value of 4 mA, whereas transistor Qn may be required to provide a collector current Icn at a value of 1 mA. Such biasing ratio of 4 mA/1 mA may be achieved by implementing transistor Q68 physically four times larger than transistor Qn. In this manner, the present invention can maintain the desired biasing currents to core mixer 18 at a fixed ratio based upon the physical size relationship among the biasing transistors.

Figure 7:
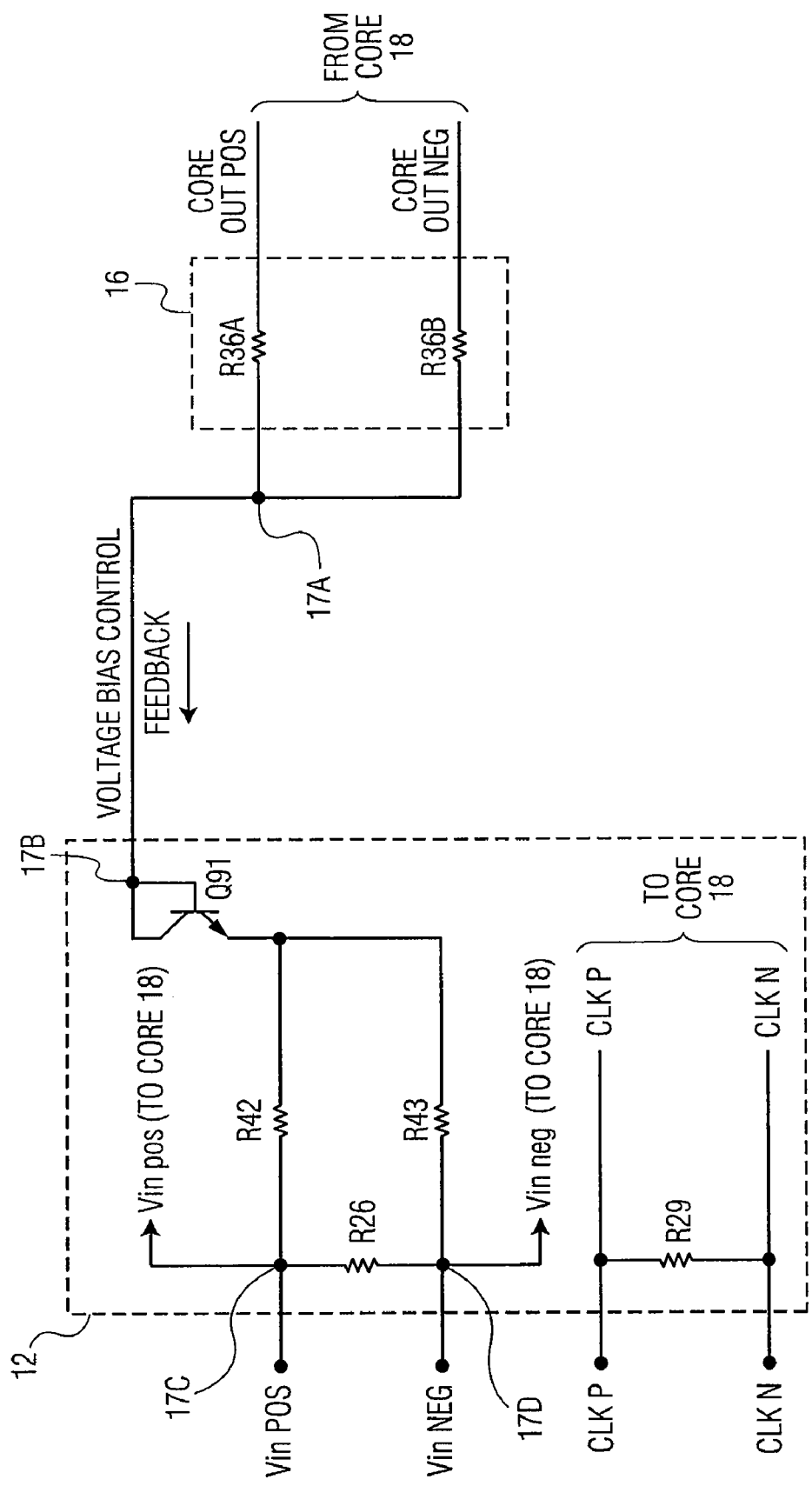
FIG. 7 is a schematic diagram of a common mode bias network and an impedance and voltage bias control network shown in FIG. 2, in accordance with an embodiment of the present invention.

Referring next to FIG. 7, the common mode bias network, designated as 16, and the impedance and voltage bias control network, designated as 12, will now be described.

The differential output from core mixer 18 (FIG. 2), namely the voltage difference between the core out positive signal and the core out negative signal, is sensed by common mode bias network 16 by way of resistor R36A and resistor R36B. Since the signal voltage across R36A and R36B is equal in magnitude but opposite in sign, node 17A is effectively a virtual ground (Vg) and includes the common mode voltage generated between the positive signal output (core out positive) and the negative signal output (core out negative). This common mode voltage at node 17A is sensed by (or fed back to) node 17B as the voltage bias control feedback signal. This voltage at node 17B is then provided to transistor Q91. As shown, transistor Q91 has its collector and base connected together and its emitter coupled into resistor R42 and resistor R43. As such, Q91 serves to step down the voltage bias control feedback signal in an amount equal to its base-emitter voltage. Node 17C and node 17D, in turn, sense substantially the same common mode voltage that is present at node 17B, less the base-emitter voltage of transistor Q91.

Transistor Q91 is required because steering transistors Q65, Q67, Q64 and Q66 (FIG. 3) have an additional transistor collector-emitter voltage drop to overcome than the input transistors Q1, Q76, Q2 and Q19. This is because the emitters of steering transistors Q65 and Q64 are connected to the collectors of input transistors Q1 and Q76. Similarly, the emitters of steering transistors Q67 and Q67 are connected to the collectors of input transistors Q19 and Q2. The transistors in core mixer 18 (Q1, Q76, Q19, Q2, Q65, Q64, Q67 and Q66) are biased by transistor Q68 in core bias network 24, as shown in FIG. 6. As such, the steering transistors are effectively sitting on top of the input transistors. In other words, the common mode voltage at the steering transistors (Q65, Q67, Q64 and Q66) is higher than the common mode voltage at the input transistors (Q1, Q76, Q2 and Q19).

In operation, common mode bias network 16 senses the differential output voltage of core mixer 18 and establishes a common center point as the common mode voltage. The common mode voltage is fed back to impedance and voltage bias control network 12. The common mode voltage is stepped down by transistor Q91 and split into two halves by way of resistors R42 and R43 to establish a common mode voltage bias at the input to core mixer 18 (transistors Q1, Q76, Q19 and Q2 shown in FIG. 3).

The input impedance is controlled by network 12 by way of resistor R26, which is connected between R42 and R43. Since the impedance level looking back from core mixer 18 has a high value, resistor R26 effectively establishes the impedance value at the input terminals, Vin positive and Vin negative. In the exemplary embodiment, the impedance level is 100 ohms between nodes 17C and 17D, and the impedance level is 50 ohms between each terminal and ground potential.

Similarly, the clock input impedance is controlled by network 12 by way of resistor R29, which is connected between the clock positive input signal and the clock negative input signal. Resistor R29 effectively establishes the impedance value between the clock input terminals, Clock Positive and Clock Negative. In the exemplary embodiment, the impedance level is 100 ohms between the input is terminals, and the impedance level is 50 ohms between each terminal and ground potential.

Figure 10:
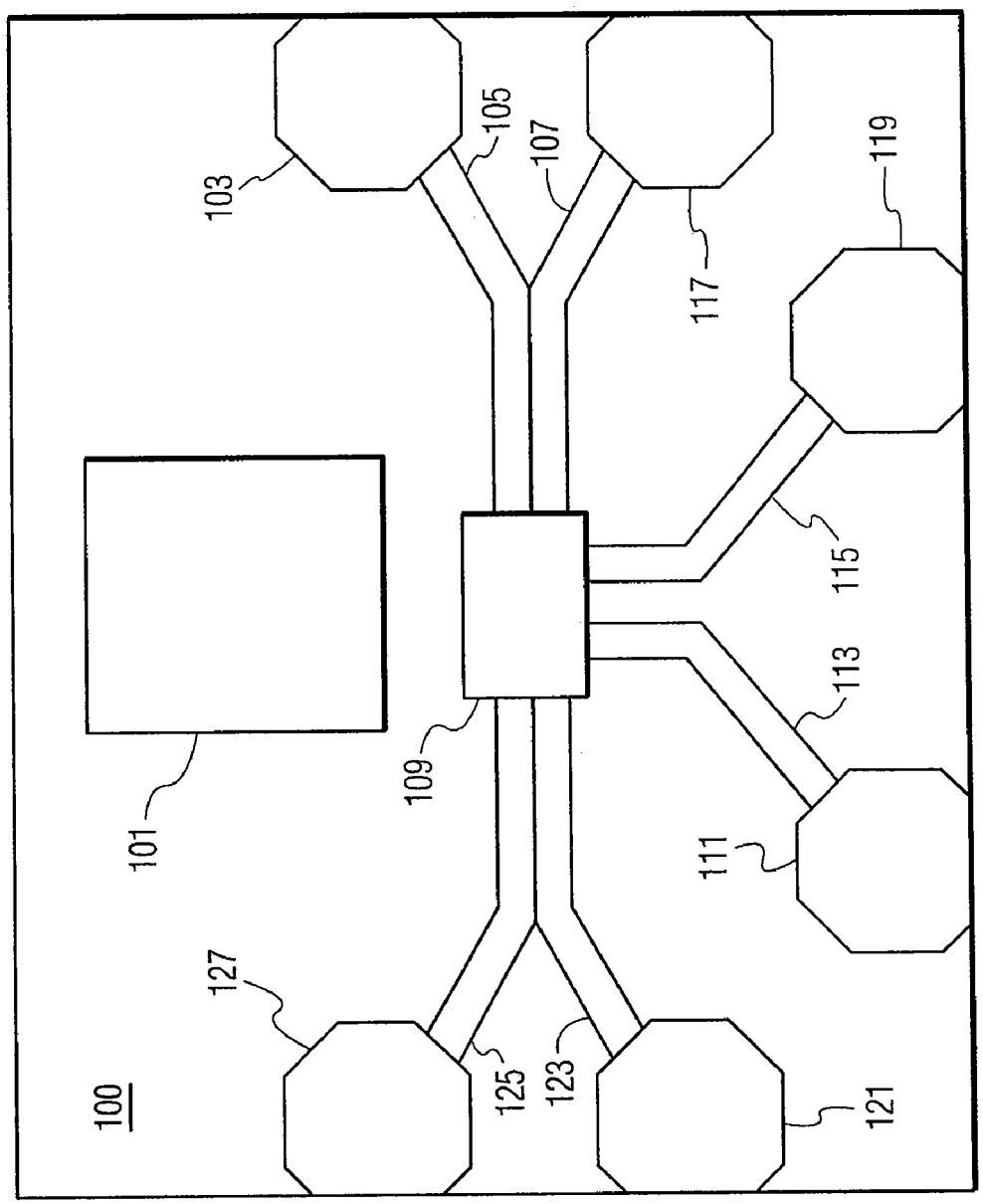
FIG. 10 is a layout diagram showing approximate sizes of various elements of the ultra wide band mixer of FIG. 2, in accordance with an embodiment of the present invention.

It will be understood that ultra wide band active mixer 10 is entirely fabricated on a substrate of a die for use as an integrated circuit. The layout of the various components shown in FIG. 2 is complex and configured using CAD tools. A functional high level block diagram of the die, generally designated as 100, is shown in FIG. 10. It will be understood that FIG. 10 is not drawn to scale and much of the layout detail is not shown. The die 100 of the integrated circuit includes an area of approximately 1000 microns by 1000 microns. The input and output pads (designated as 111, 119, 103 and 117) as well as the voltage and ground pads (not shown) are approximately 100 microns by 100 microns each.

The Y-shaped lines shown in FIG. 10 are the input transmission lines (designated as 113 and 115), which are disposed between the input pads (111, 119) and the core mixer (designated as 109). Similarly, the Y-shaped output transmission lines (designated as 105 and 107) are disposed between the core mixer 109 and output pads (103, 117). The Y-shaped clock input lines (designated as 123 and 125) are disposed between core mixer 109 and the clock input pads (designated as 121 and 127). Also shown in FIG. 10 is the bandwidth peaking network (designated as 101), which is physically larger than core mixer 109. The core mixer has a size of approximately 100 microns by 30 microns.

Each of the transmission lines has a controlled impedance of 50 ohms. The width of each transmission line is approximately 25 microns.

It will be appreciated that the transistors and the resistors are configured on the die to have a common centroid arrangement. For example, the transistors shown schematically in FIG. 3, namely Q1, Q76, Q19 and Q2, are arranged as shown in FIG. 8. The arrangement of these four transistors is shown designated generally as 80. Similarly, the resistors of common mode bias network 16, shown schematically in FIG. 7, are also configured on the die in a common centroid arrangement. As shown in FIG. 9, resistor R36A and resistor R36B are configured as one half of resistor R36B disposed in the first quadrant of arrangement 90 and the other half of resistor R36B disposed in the third quadrant of arrangement 90. Similarly, resistor R36A is divided in half as shown, where one half is disposed in the second quadrant and the other half is disposed in the fourth quadrant.

Figure 12:
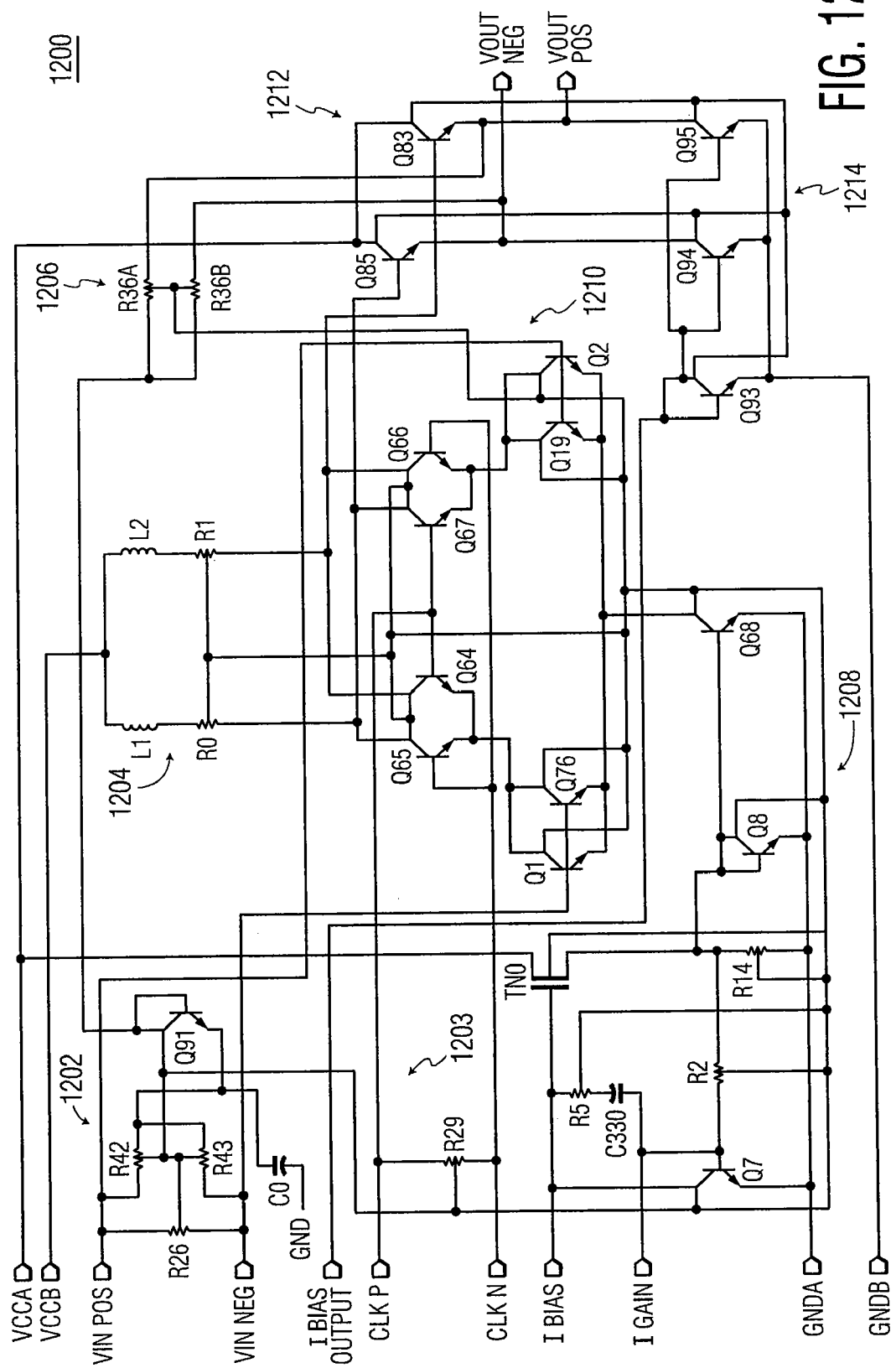
FIG. 12 is a detailed schematic diagram of the ultra wide band mixer shown in FIGS. 1 and 2, in accordance with an embodiment of the present invention; and, FIGS. 13A, 13B, 13C, 13D, 13E and 13F are plots showing the relationships among the input signals, the clock signals (reference signals) and the output signals (in arbitrary units).

FIG. 12 depicts the ultra wide band active mixer in greater detail. As shown, ultra wide band active mixer 1200 includes impedance and voltage bias control network 1202 and common mode bias network 1206 (previously described by reference to FIG. 7). Also shown in FIG. 12 is bandwidth peaking network 1204 and core mixer 1210 (previously described by reference to FIG. 3). The optional resistor R21 (shown in FIG. 3) has been omitted. Buffer 1212 and output bias network 1214 (previously described, respectively, by reference to FIGS. 4 and 5) are shown on the right hand side of FIG. 12. Lastly, core bias network 1208 is shown at the bottom portion of FIG. 12 (previously described by reference to FIG. 6).

Also shown in FIG. 12 are connections from each transistor to the substrate of the die, connections from each resistor to the substrate, connections from each coil to the substrate, and connections from each capacitor to the substrate. These connections have been omitted in the other figures of ultra wide band active mixer 10. The ultra wide band active mixer shown in FIG. 12 is implemented using selective-epitaxial SiGe bipolar transistors. The transistors shown in FIG. 12 may also be implemented using other materials including, but not limited to silicon, GaAs, InP and AlGaAs.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A wideband mixer comprising
a core mixer having input terminals and output terminals for, respectively, receiving differential input signals and providing differential output signals,
a steering module, coupled to the core mixer, for receiving differential reference signals as a first reference signal and a second reference signal,
the core mixer configured to provide bi-phase modulated differential output signals in response to the first and second reference signals,
a bandwidth peaking network including (a) a first coil and a first resistor connected in series and (b) a second coil and a second resistor connected in series,
the first coil and resistor and the second coil and resistor, respectively, coupled to the core mixer for receiving differential core signals and outputting the differential output signals, and
the bandwidth peaking network configured to increase the frequency bandwidth of the core mixer.

2. The wideband mixer of claim 1, wherein
the core mixer is configured to provide a value of gain between the differential input signals and the differential output signals.

3. The wideband mixer of claim 2, wherein
the core mixer is configured to provide a value of gain that is adjustable.

4. The wideband mixer of claim 1 including
a common mode bias network coupled between the output terminals for providing a voltage bias control feedback signal across the input terminals, and
the voltage bias control feedback signal providing a virtual ground common mode potential.

5. The wideband mixer of claim 4, wherein
the common mode potential across the input terminals is substantially equal to a DC potential across the output terminals.

6. A wideband mixer comprising
a core mixer having input terminals and output terminals for, respectively, receiving differential input signals and providing differential output signals,
a steering module, coupled to the core mixer, for receiving differential reference signals as a first reference signal and a second reference signal,
a bandwidth peaking network including (a) a first coil and a first resistor connected in series and (b) a second coil and a second resistor connected in series, and
the first coil and resistor and the second coil and resistor, respectively, coupled to the core mixer for receiving differential core signals and outputting the differential output signals,
wherein the bandwidth peaking network is configured to increase the frequency bandwidth of the core mixer, and
the core mixer is configured to provide bi-phase modulated differential output signals in response to the first and second reference signals.

7. The wideband mixer of claim 6 wherein
the core mixer includes a first amplifier and a second amplifier for receiving the differential input signals,
the steering module includes a first set of steering transistors and a second set of steering transistors, each set of steering transistors receiving both the first and second reference signals,
the first amplifier is coupled to the first set of steering transistors and the second amplifier is coupled to the second set of steering transistors,
the first amplifier and the second amplifier amplify the received differential input signals to provide the differential core signals,
the first set of steering transistors sequentially steers one of the differential core signals to one or the other of the output terminals as the bi-phase modulated differential output signals, and
the second set of steering transistors sequentially steers another of the differential core signals to one or the other of the output terminals as the bi-phase modulated differential output signals.

8. The wideband amplifier of claim 7 wherein
the first set of steering transistors are configured to turn ON or OFF in response to the first and second reference signals, and
the second set of steering transistors are configured to turn ON or OFF in response to the first and second reference signals.

9. The wideband mixer of claim 8 wherein
each of the sets of steering transistors includes a plurality of switching transistors, and when one of the plurality of switching transistors is turned ON, another of the plurality of switching transistors is turned OFF.

10. The wideband mixer of claim 7 wherein
the bandwidth peaking network includes (a) a first node formed between the first coil and resistor and (b) a second node formed between the second coil and resistor,
a third resistor is connected between the first node and the second node, and
the third resistor is free-of current flow at low frequency operation of the core mixer.

11. The wideband mixer of claim 10 wherein
the bandwidth peaking network is configured to provide a substantially constant gain across the frequency bandwidth of the amplifier.

12. The wideband mixer of claim 10 wherein
the first amplifier is coupled to an end of the first resistor, and the second amplifier is coupled to an end of the second resistor.

13. The wideband mixer of claim 7 including
a common mode bias network coupled between the output terminals for providing a voltage bias control feedback signal across the input terminals, and
the voltage bias control feedback signal providing a virtual ground common mode potential.

14. The wideband mixer of claim 13 wherein
the common mode potential across the input terminals is substantially equal to a DC potential across the output terminals.

15. The wideband mixer of claim 7 wherein
the first amplifier and the second amplifier are configured as physically similar to each other on a die, and
the first set of steering transistors and the second set of steering transistors are configured as physically similar to each other on the die.

16. The wideband mixer of claim 15 wherein
the first amplifier and the second amplifier are formed in a common centroid configuration on the die, and
the first set of steering transistors and the second set of steering transistors are formed in another common centroid configuration on the die.

17. A wideband mixer comprising
a core mixer having input terminals and output terminals for, respectively, receiving differential input signals and providing differential output signals,
the core mixer including a first amplifier and a second amplifier for receiving the differential input signals,
a steering module, coupled to the core mixer, for receiving differential reference signals as a first reference signal and a second reference signal,
the steering module including a first set of steering transistors and a second set of steering transistors, each set of steering transistors receiving both the first and second reference signals,
the first amplifier coupled to the first set of steering transistors and the second amplifier coupled to the second set of steering transistors,
a bandwidth peaking network including (a) a first coil and a first resistor connected in series and (b) a second coil and a second resistor connected in series, and
the first coil and resistor and the second coil and resistor, respectively, coupled to the first and second amplifiers, by way of the respective first and second sets of steering transistors,
wherein the first set of steering transistors sequentially steers an amplified output signal from the first amplifier to one or the other of the output terminals as a bi-phase modulated differential output signal, and
the second set of steering transistors sequentially steers another amplified output signal from the second amplifier to one or the other of the output terminals as another bi-phase modulated differential output signal.

18. The wideband mixer of claim 17 wherein
the first and second amplifiers are biased by a common voltage reference point.

19. The wideband mixer of claim 18 wherein
the common voltage reference point includes an adjustable voltage level for controlling amplification levels of the first and second amplifiers.

* * * * *